(12) United States Patent
Wang et al.

(10) Patent No.: US 12,167,553 B2
(45) Date of Patent: Dec. 10, 2024

(54) PCI-E EXPANSION CARD MODULE

(71) Applicant: ASUSTeK COMPUTER INC., Taipei (TW)

(72) Inventors: Xu Wang, Taipei (TW); Hui He, Taipei (TW); Wei Tang, Taipei (TW); Jung-Kai Chang, Taipei (TW); Yuan-Yu Lin, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 0 days.

(21) Appl. No.: 17/974,497

(22) Filed: Oct. 26, 2022

(65) Prior Publication Data

US 2023/0354534 A1 Nov. 2, 2023

(30) Foreign Application Priority Data

Apr. 27, 2022 (CN) .......................... 202220996147.0

(51) Int. Cl.
*H05K 5/02* (2006.01)

(52) U.S. Cl.
CPC ......... *H05K 5/0221* (2013.01); *H05K 5/0269* (2013.01)

(58) Field of Classification Search
CPC ....................................................... H05K 5/02
See application file for complete search history.

(56) References Cited

U.S. PATENT DOCUMENTS

2009/0067136 A1* 3/2009 Cheney ................ H05K 7/1431
361/726
2013/0288504 A1* 10/2013 Sass .................... H01R 12/7029
439/328

FOREIGN PATENT DOCUMENTS

| CN | 201569953 | 9/2010 |
|----|-----------|--------|
| CN | 205485760 | 8/2016 |
| CN | 109542181 | 3/2019 |
| CN | 110858091 | 3/2020 |
| CN | 112068660 | 12/2020 |
| CN | 113407010 | 9/2021 |
| CN | 214846545 | 11/2021 |

* cited by examiner

*Primary Examiner* — Jerry Wu
(74) *Attorney, Agent, or Firm* — JCIPRNET

(57) ABSTRACT

A PCI-E expansion card module is configured to insert in a slot with a rotation switch. The PCI-E expansion card module includes a PCI-E expansion card body and an unlock mechanism. The PCI-E expansion card body includes an inserting portion and a positioning hook. The unlock mechanism is disposed beside the PCI-E expansion card body, and the unlock mechanism includes a pushing member. When the PCI-E expansion card body is inserted into the slot, the rotation switch is on a moving path of the pushing member. The pushing member moves and pushes the rotation switch to release a limitation of the PCI-E expansion card body.

10 Claims, 6 Drawing Sheets

PCI-E EXPANSION CARD MODULE

CROSS-REFERENCE TO RELATED APPLICATION

This application claims the priority benefit of China application serial no. 202220996147.0, filed on Apr. 27, 2022. The entirety of the above-mentioned patent application is hereby incorporated by reference herein and made a part of this specification.

BACKGROUND

Technical Field

The disclosure relates to a PCI-E expansion card module, and in particular to a PCI-E expansion card module with an unlock mechanism.

Description of Related Art

Generally, if you want to unlock the PCI-E expansion card inserted into the motherboard slot, you need to turn the pressure tail clip (commonly known as the whale tail clip) next to the slot to lift the expansion card to unlock. However, with the development of science and technology, the motherboard is equipped with various peripheral devices and heat dissipation components, which will cause the pressure tail clip to be blocked and difficult to turn.

In order to unlock the PCI-E expansion card smoothly, the user will use other tools to press the end buckle, or directly forcibly remove the PCI-E expansion card. However, it is easy to damage the motherboard and expansion cards, resulting in poor user experience.

SUMMARY

According to an aspect of this disclosure, A PCI-E expansion card module is provided. The PCI-E expansion card module is configured to insert in a slot with a rotation switch and includes a PCI-E expansion card body and an unlock mechanism. The PCI-E expansion card body includes an inserting portion and a positioning hook. The unlock mechanism is disposed beside the PCI-E expansion card body, and the unlock mechanism includes a pushing member. When the PCI-E expansion card body is inserted into the slot, the rotation switch is on a moving path of the pushing member. The pushing member moves and pushes the rotation switch to release a limitation of the PCI-E expansion card body.

Based on the above, the PCI-E expansion card module pushes the rotation switch through the unlocking mechanism, so that the PCI-E expansion card body can be released from the slot. In this way, even if the rotation switch is blocked by the computer components or the expansion card, the user can still easily unlock the PCI-E expansion card relative to the slot.

DESCRIPTION OF THE EMBODIMENTS

Figure 1A:
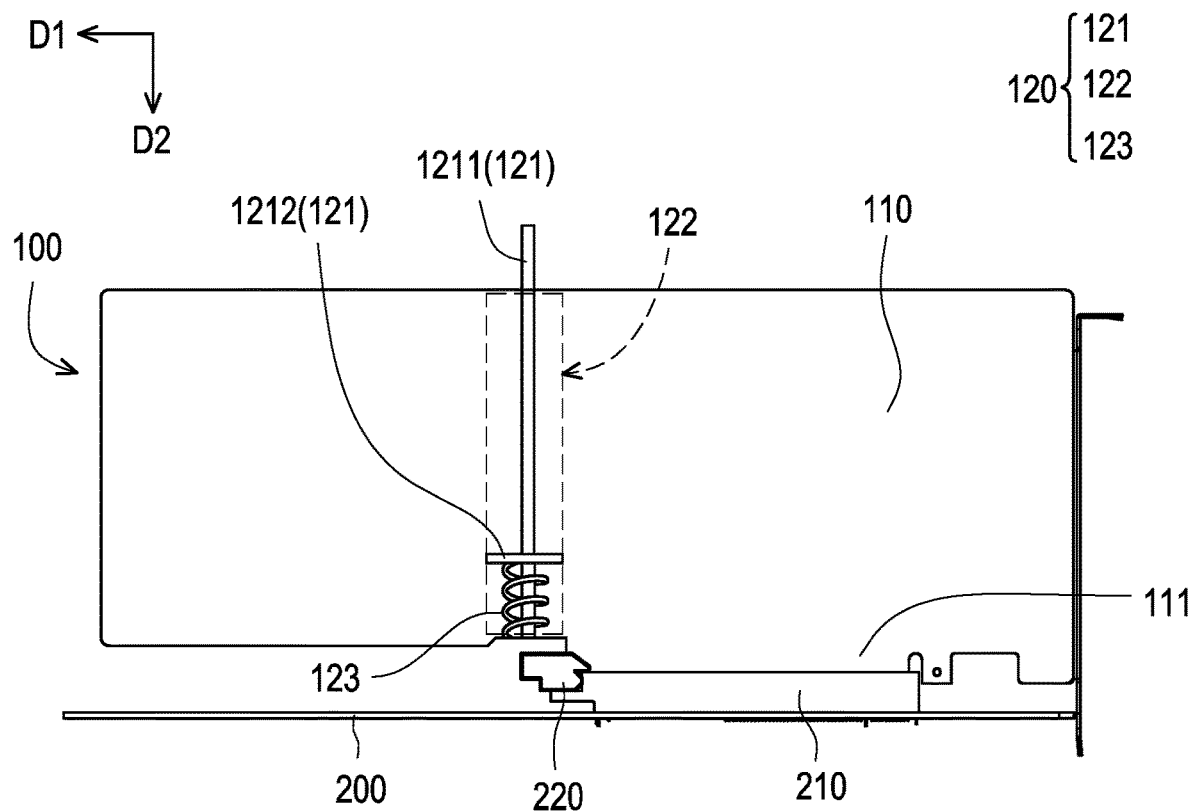
FIG. 1A is a schematic appearance diagram of a PCI-E expansion card module according to an embodiment of the application.
Figure 1B:
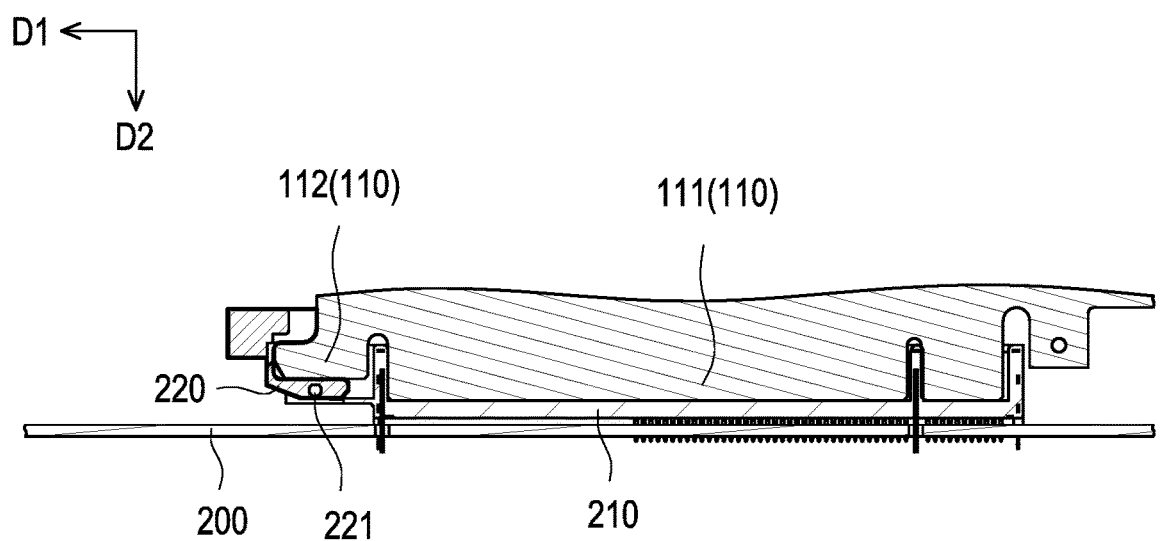
FIG. 1B is a partial cross-sectional view of FIG. 1A.

Referring to the FIG. 1A and FIG. 1B, it should be noted that, in order to clearly see the internal components of the shell, the shell is shown in perspective with dotted lines. The PCI-E expansion card module 100 of the embodiment is suitable for being inserted into a slot 210 on a circuit board 200. The PCI-E expansion card module 100 includes a PCI-E expansion card body 110 and an unlock mechanism 120 disposed beside the PCI-E expansion card body 110. The PCI-E expansion card body 110 of the embodiment is, for example, a display card, and the slot 120 is, for example, a PCI-E slot. However, the types of the PCI-E expansion card body 110 and the slot 120 are not limited thereto.

The PCI-E expansion card body 110 of the embodiment includes an inserting portion 111 and a positioning hook 112 (FIG. 1B). The slot 210 includes a rotation switch 220. When the inserting portion 111 of the PCI-E expansion card body 110 is inserted into the slot 210, the positioning hook 112 and the rotation switch 220 are engaged with each other, so that the PCI-E expansion card module 100 is firmly inserted into the circuit board 200.

On the other hand, as shown in FIG. 1A, the unlock mechanism 120 includes a pushing member 121, a shell 122 and an elastic member 123. The pushing member 121 includes a rod body 1211 and a plate 1212 protruding from the periphery of the rod body 1211. The inserting portion 111 extends along a first direction D1, and the rod body 1211 of the pushing member 121 is movably arranged along a second direction D2 perpendicular to the first direction D1 in the shell 122. When the PCI-E expansion card body 110 is inserted into the slot 210, the rotation switch 220 is located on the moving path of the pushing member 121.

The shell 122 is provided with holes to allow the pushing member 121 to pass through the shell 122 and be exposed on the shell 122. The user can push the pushing member 121 exposed on the shell 122 to push the rotation switch 220.

The following describes the operation process of the unlocking mechanism 120 of the embodiment to release the limit of the PCI-E expansion card body 110. Referring to FIG. 1A to FIG. 2B, when the rod body 1211 of the pushing member 121 is forced to move along the second direction D2, the rod body 1211 further pushes the rotation switch 220.

Figure 2A:
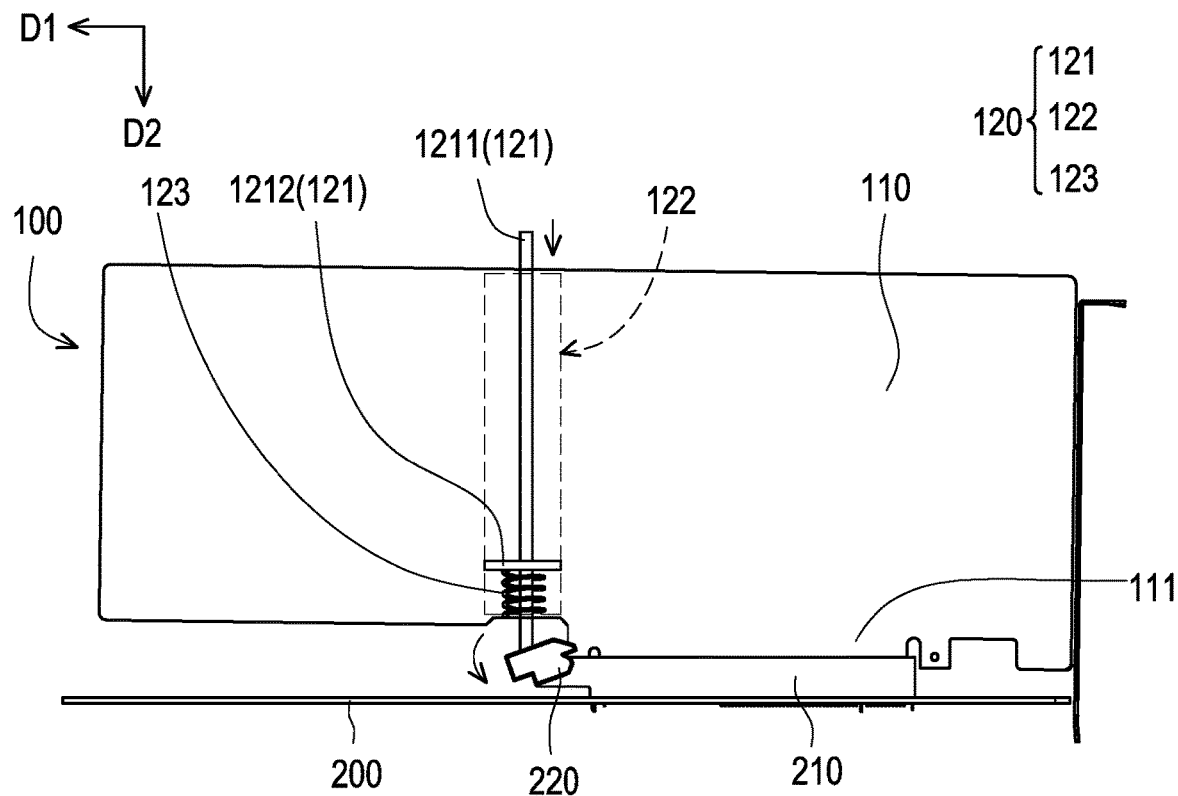
FIG. 2A is a schematic diagram of the unlocking mechanism of FIG. 1A pushing the rotation switch.
Figure 2B:
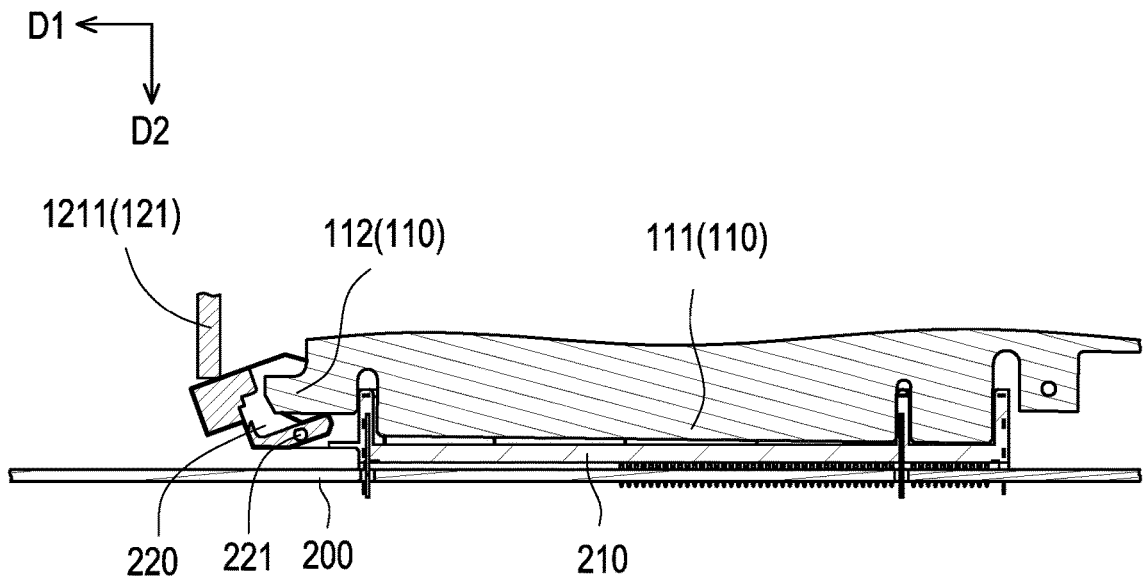
FIG. 2B is a partial cross-sectional view of FIG. 2A.

When the rotation switch 220 is pushed by the rod body 1211, the rotation switch 220 may rotate relative to a rotating shaft 221 (FIG. 1B. FIG. 2B) from a locked state as shown in FIGS. 1A and 1B to an unlocked state as shown in FIGS. 2A and 2B. The rotation switch 220 pushes the positioning hook 112 during the rotation, and releases the limit on the PCI-E expansion card body 110.

In an embodiment, the elastic member 123 is sleeved on the rod body 1211 and abuts on a plate 1212 and a shell 122, and the elastic member 123 is, for example, a compression spring. When the rod body 1211 is pushed by the pushing force along the second direction D2, the elastic member 123 is squeezed by the plate 1212 of the rod body 1211 to generate elastic restoring force. When the rod body 1211 is no longer under the force, the rod body 1211 is pushed by the elastic restoring force of the elastic member 123, and returns to the position of FIG. 1A from the position of FIG. 2A.

One end of the pushing member 121 of the embodiment is far away from the rotation switch 220 in the slot 210. Therefore, when the rotation switch 220 of the PCI-E expansion card module 10 is shielded by the computer equipment on the motherboard 200 which makes the rotation switch 220 difficult to be pressed, the user can easily release the restriction of the PCI-E expansion card body 110 through the pushing member 121 without causing damage to the slot 210 or the PCI-E expansion card body 110.

Figure 3A:
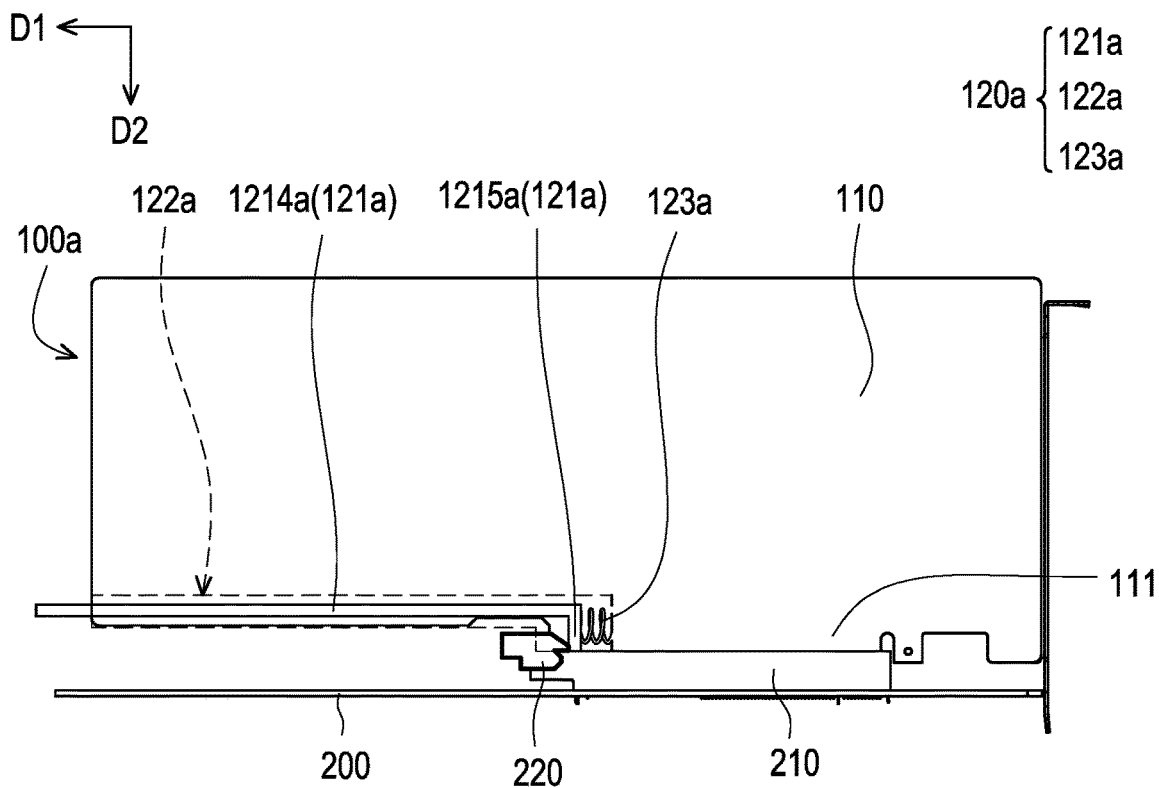
FIG. 3A is a schematic appearance diagram of a PCI-E expansion card module according to another embodiment of the application.
Figure 3B:
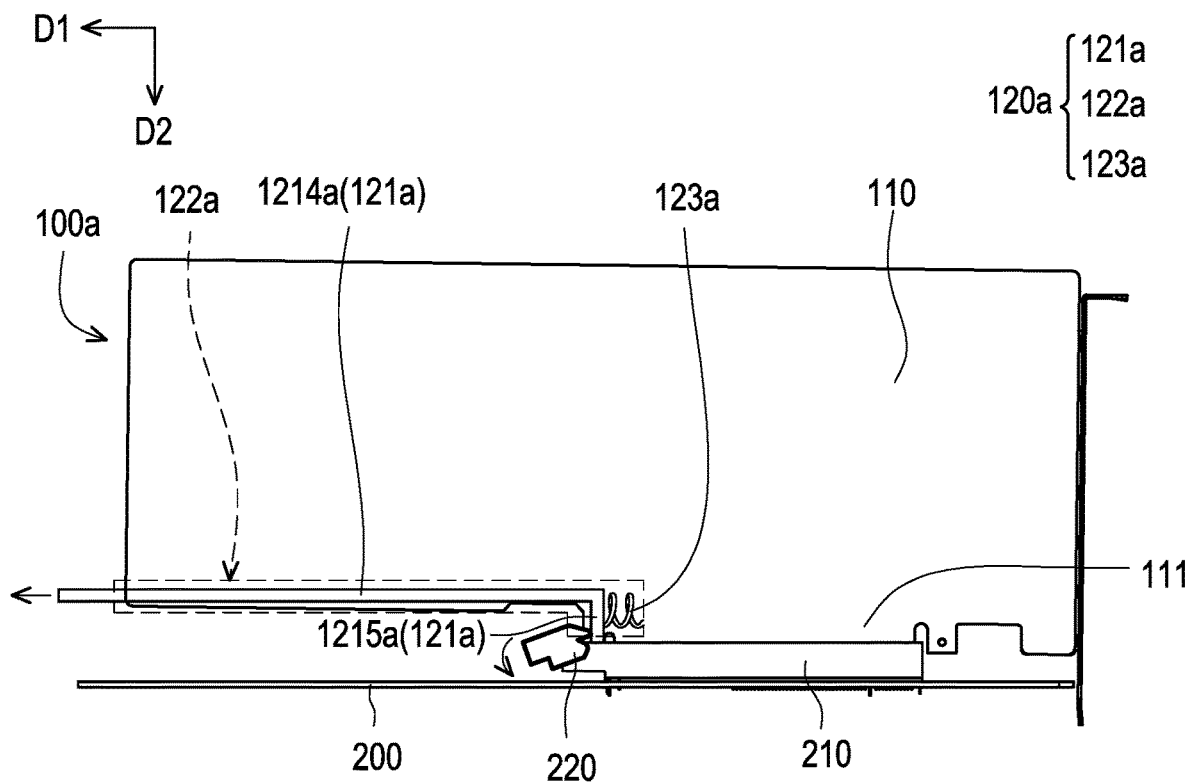
FIG. 3B is a schematic diagram of the unlocking mechanism of FIG. 3A pushing the rotation switch.

Referring to FIG. 3A and FIG. 3B, the main difference between the unlocking mechanism 120a of the embodiment and the unlocking mechanism 120 of FIGS. 1A and 1B is that, the pushing member 121a of the embodiment includes a first segment 1214a and a second segment 1215a connected to the first segment 1214a by bending. The first segment 1214a extends along the first direction D1, the second segment 1215a is adapted to abut against the rotation switch 220.

Specifically, the pushing member 121a is movably disposed in the shell 122a along the first direction D1. When the first segment 1214a of the pushing member 121a is stressed and moves along the first direction D1 relative to the PCI-E expansion card body 110, the first segment 1214a drives the second segment 1215a to move. The second segment 1215a then pushes the rotation switch 220 to rotate, so that the limit of the PCI-E expansion card body 110 is released.

In an embodiment, the elastic member 123a is abutted against the shell 122a and the second segment 1215a of the pushing member 121a, and the elastic member 123a is, for example, a tension spring. When the pushing member 121a is in the unlocked state as shown in FIG. 3B and no longer under force, the elastic member 123a stretched by the second segment 1215a provides elastic restoring force, so that the pushing member 121a returns from the position of FIG. 3B to the position of FIG. 3A.

Figure 4A:
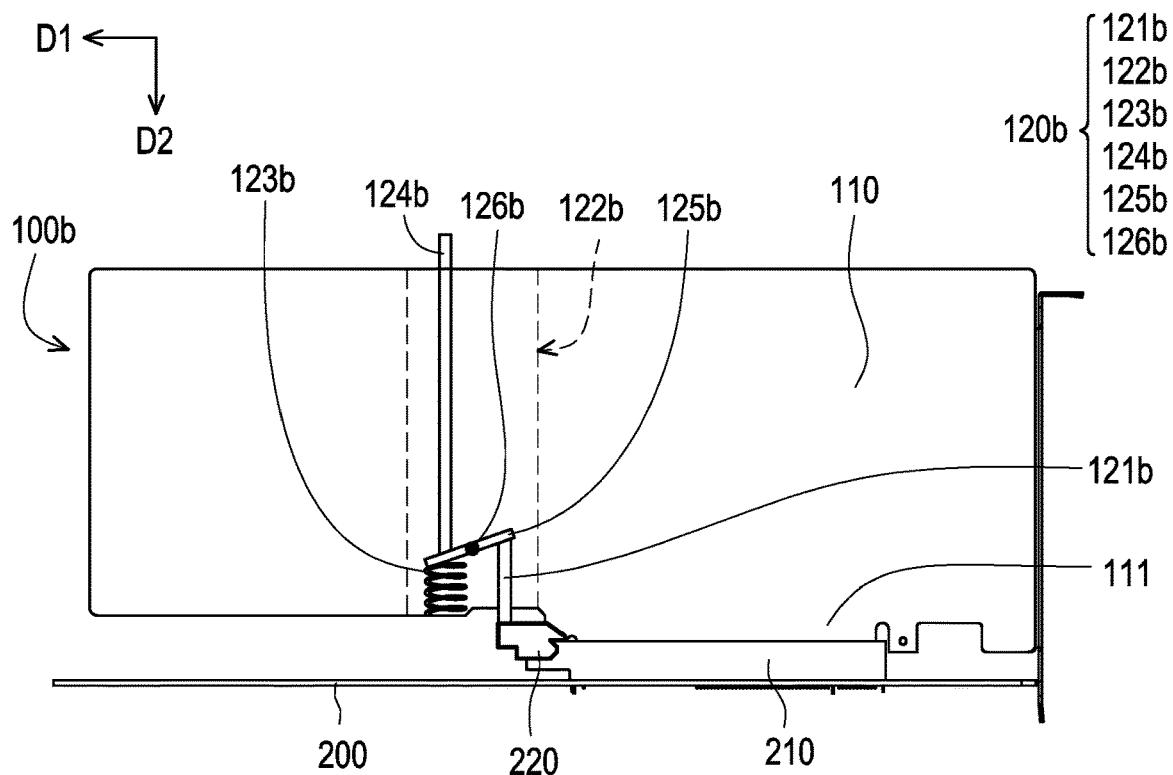
FIG. 4A is a schematic appearance diagram of a PCI-E expansion card module according to another embodiment of the application.
Figure 4B:
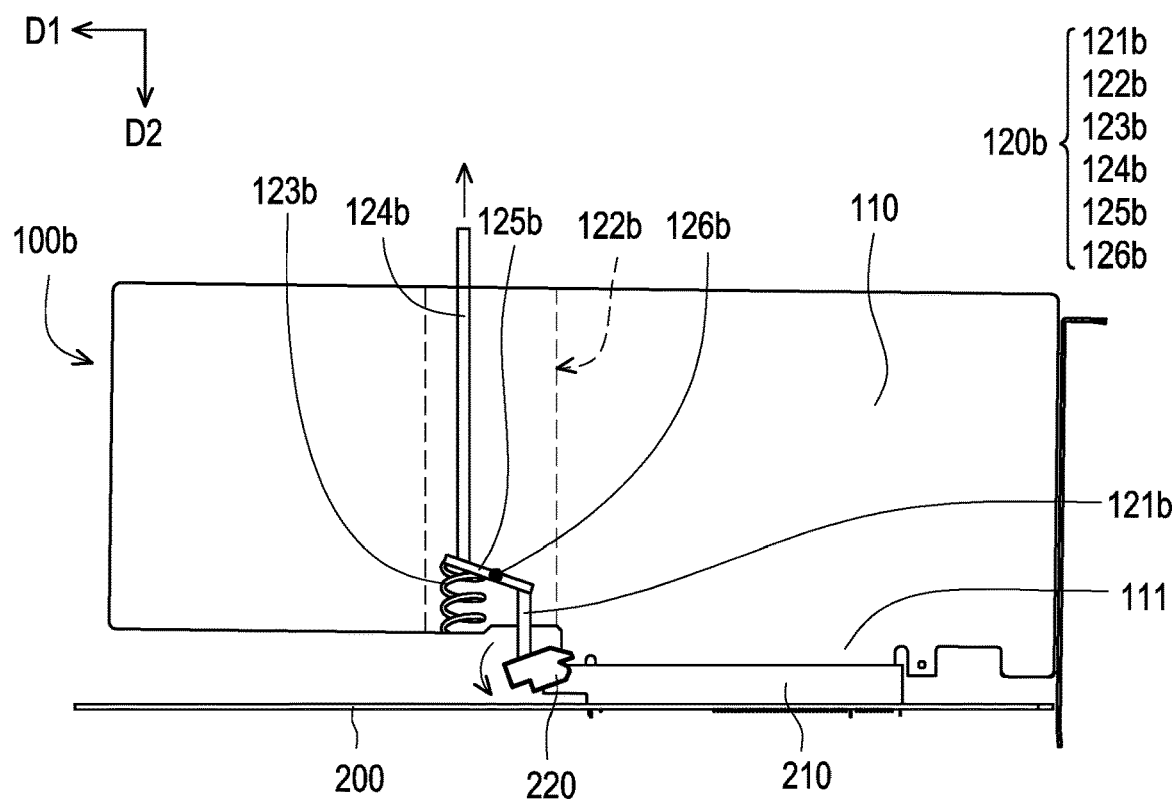
FIG. 4B is a schematic diagram of the unlocking mechanism of FIG. 4A pushing the rotation switch.

Referring to FIG. 4A and FIG. 4B, the main difference between the unlocking mechanism 120b of the embodiment and the unlocking mechanism 120 of FIGS. 1A and 1B is that, the unlocking mechanism 120b of the embodiment includes a pulling member 124b and a lever 125b. The lever 125b is located in the shell 122b and is pivotally connected to the shell 122b by a pivot 126b. The pushing member 121b and the pulling member 124b are movably disposed in the shell 122b. The pulling member 124b is connected to one end of the lever 125b, the pushing member 121b is abutted against the other end of the lever 125b.

Specifically, when the pulling member 124b is forced to move in the opposite direction of the second direction D2 relative to the PCI-E expansion card body 110, the lever 125b is pulled and rotated by the pulling member 124b, thereby driving the pushing member 121b to move along the second direction D2. The pushing member 121b moves and pushes the rotation switch 220 to rotate, so that the limit of the PCI-E expansion card body 110 is released. At this time, the user can take out the PCI-E expansion card body 110 from the slot 210 on the circuit board 200 along the opposite direction of the second direction D2.

It should be noted that the direction in which the user pulls the pulling member 124b is the same as the direction in which the PCI-E expansion card body 110 is taken out. This design allows the user to operate more intuitively without having to think about the direction of the pulling member 124b.

In an embodiment, elastic member 123b is abutted against the shell 122b and the lever 125b, and the elastic member 123b is, for example, a tension spring. When the pulling member 124b is in the unlocked state as shown in FIG. 4B and no longer under force, the elastic member 123b stretched by the lever 125b provides elastic restoring force, so that the elastic member 123b pulls the lever 125b. Then, the pushing member 121b and the pulling member 124b are driven to return from the position of FIG. 4B to the position of FIG. 4A.

Figure 5A:
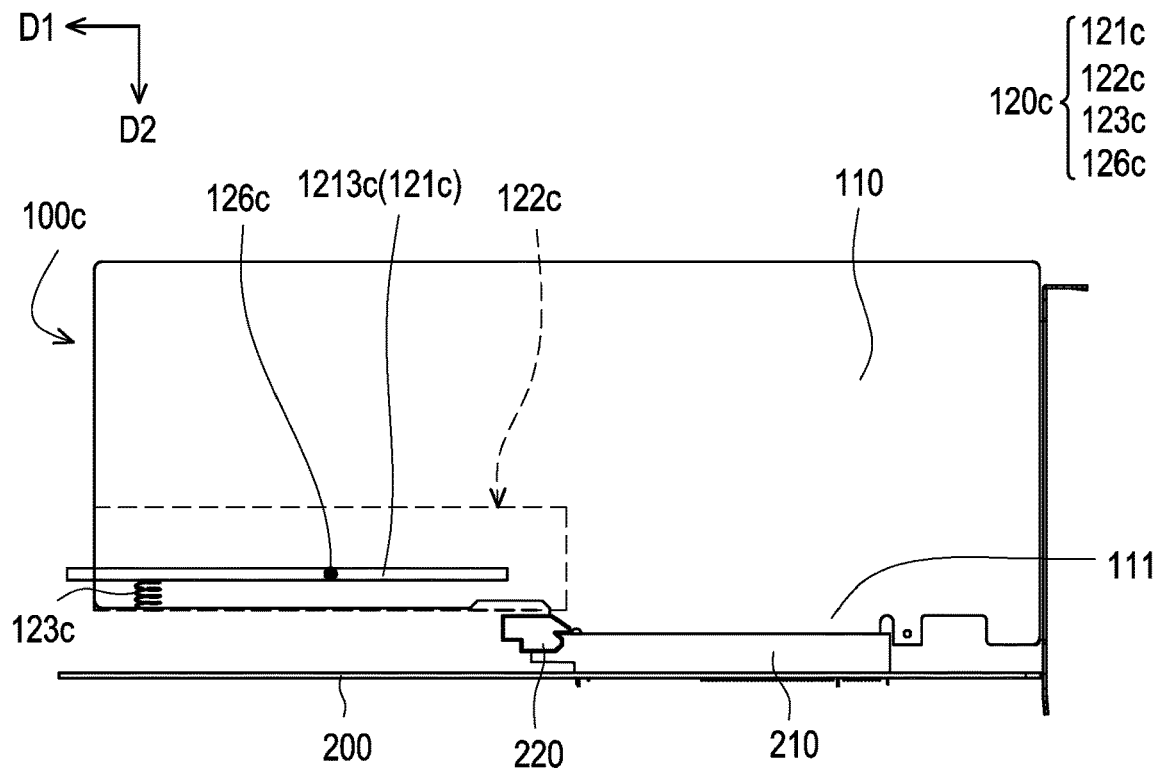
FIG. 5A is a schematic appearance diagram of a PCI-E expansion card module according to another embodiment of the application.
Figure 5B:
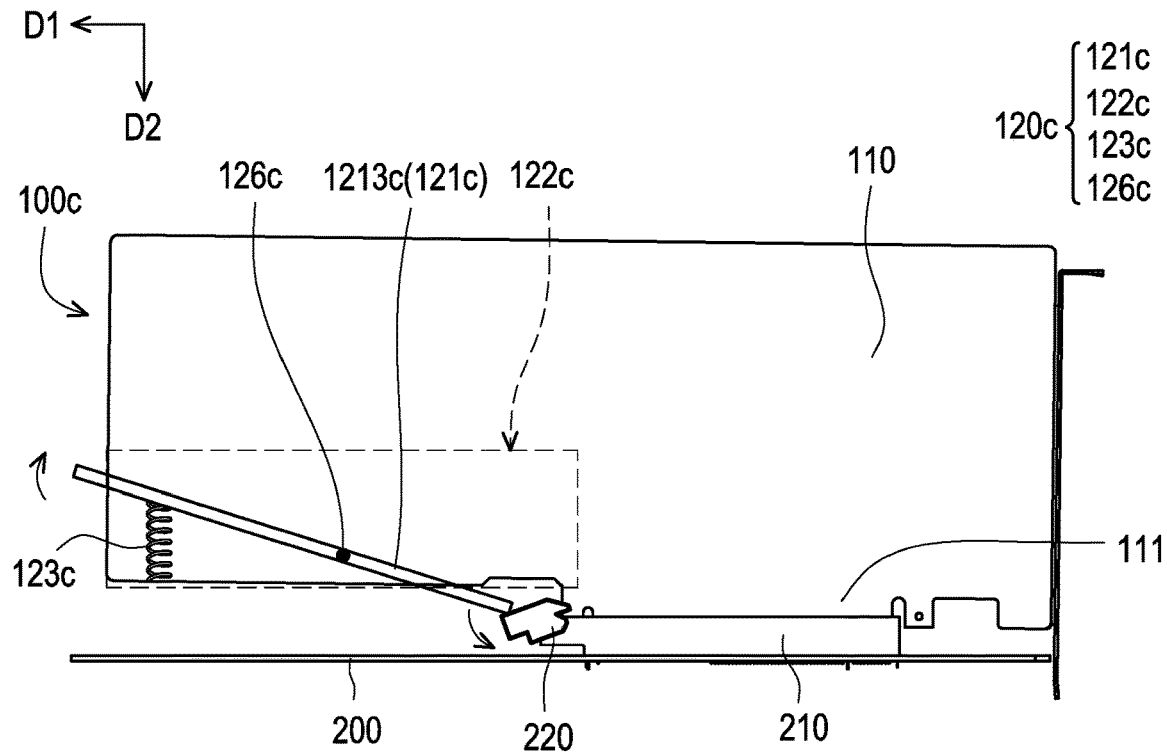
FIG. 5B is a schematic diagram of the unlocking mechanism of FIG. 5A pushing the rotation switch.

Referring to FIG. 5A and FIG. 5B, the unlocking mechanism 120c of the embodiment includes a pushing member 121c, a shell 122c and an elastic member 123c. The pushing member 121c of the unlocking mechanism 120c includes a lever 1213c. The lever 1213c of the pushing member 121c is rotatably pivoted to the shell 122c, and one end of the lever 1213c is adapted to abut against the rotation switch 220.

Specifically, when one end of the lever 1213c of the pushing member 121c is stressed, the lever 1213c of the pushing member 121c rotates relative to the PCI-E expansion card body 110 along a pivot 126c, thereby driving the other end of the lever 1213c to rotate. Since the rotation switch 220 is located on the rotation path of the lever 1213c, the other end of the lever 1213c may push the rotation switch 220 to rotate, so that the limit of the PCI-E expansion card body 110 is released.

Both ends of the elastic member 123c of the embodiment is abutted against the lever 1213c and the shell 122c respectively, and the elastic member 123c is, for example, a tension spring. When the lever 1213c is under force and rotates relative to the PCI-E expansion card body 110, the elastic member 123c is stretched by the lever 1213c to generate elastic restoring force. When the lever 1213c is no longer under the force in the unlocked state as shown in FIG. 5B, the elastic member 123c stretched by the lever 1213c provides an elastic restoring force, which pulls the lever 1213c from the position of FIG. 5B to the position of FIG. 5A.

Figure 6A:
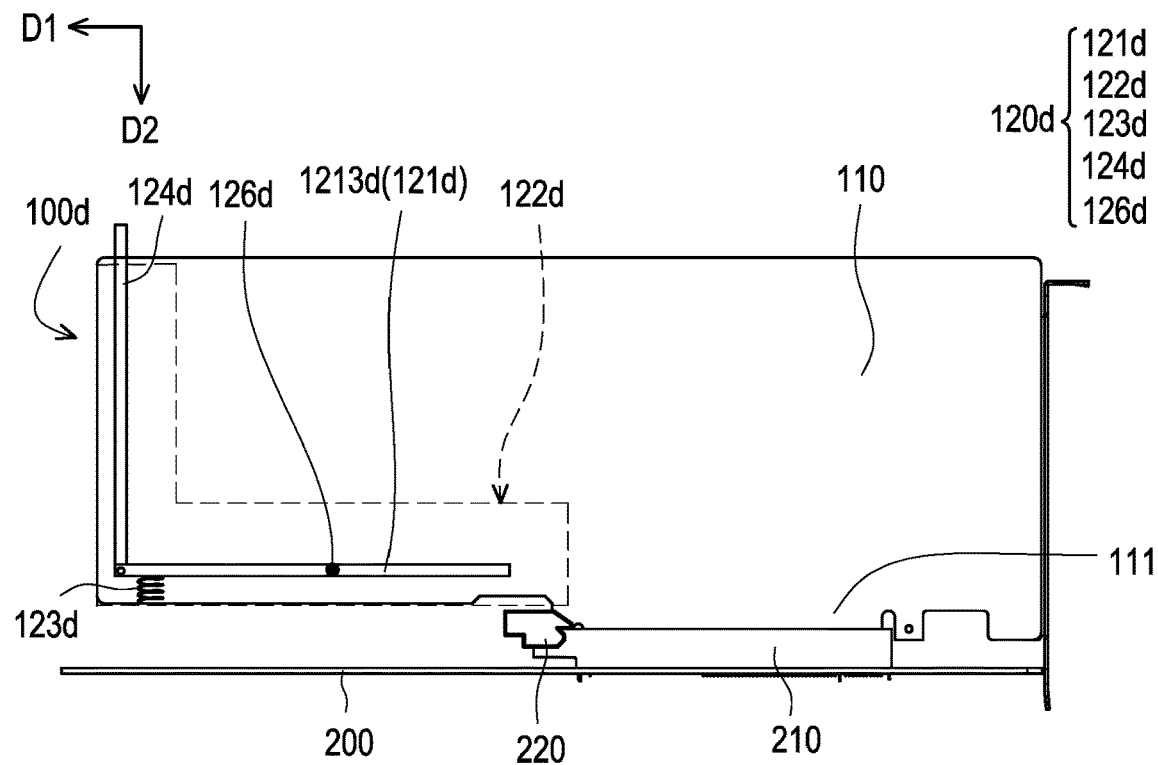
FIG. 6A is a schematic appearance diagram of a PCI-E expansion card module according to another embodiment of the application.
Figure 6B:
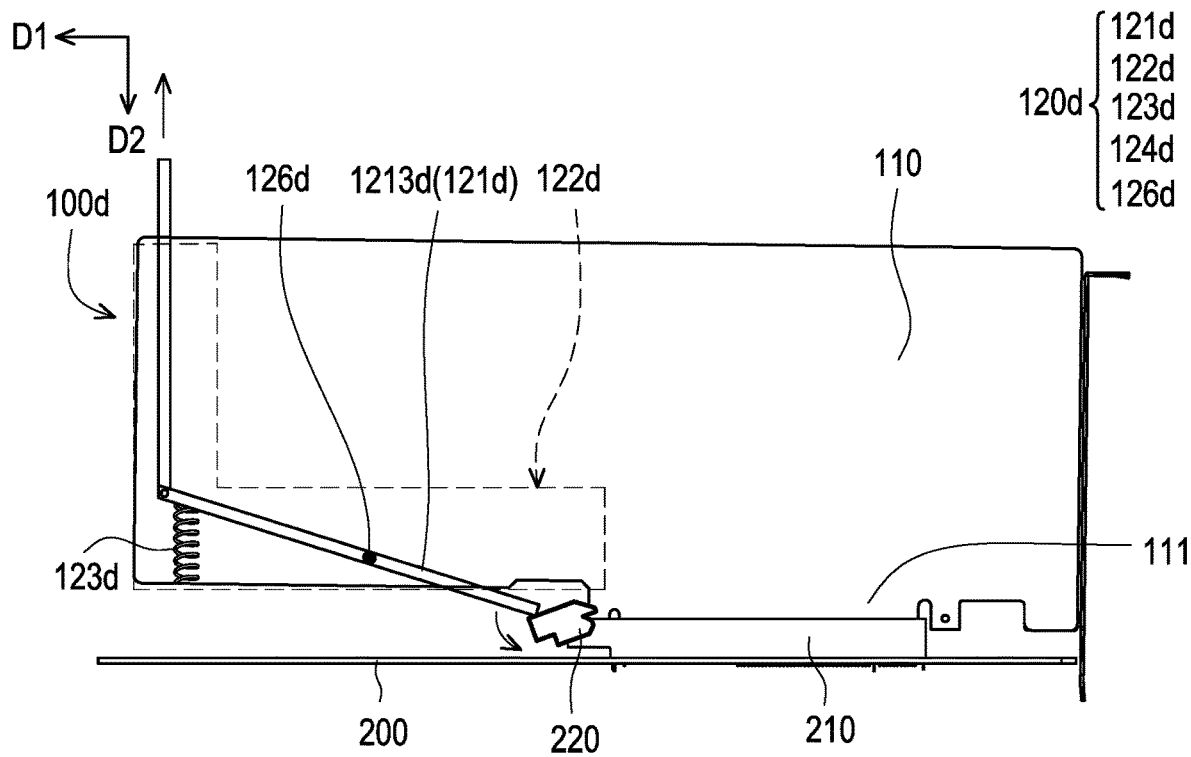
FIG. 6B is a schematic diagram of the unlocking mechanism of FIG. 6A pushing the rotation switch.

Referring to FIG. 6A and FIG. 6B, the main difference between the unlocking mechanism 120d of the embodiment and the unlocking mechanism 120c of FIGS. 5A and 5B is that, the unlocking mechanism 120d of the embodiment further includes a pulling member 124d. The pulling member 124d is connected to one end of the lever 1213d of the pushing member 121d, and the other end of the lever 1213d of the pushing member 121d is adapted to abut against the rotation switch 220.

Specifically, when one end of the pulling member 124d is forced to move in the opposite direction of the second direction D2 relative to the PCI-E expansion card body 110, the other end of the pulling member 124d drives the lever 1213d of the pushing member 121d to rotate. Therefore, the rotation switch 220 is pushed to rotate, so that the limit of the PCI-E expansion card body 110 is released.

The unlocking mechanism 120d of the embodiment further includes a shell 122d and an elastic member 123d, and the pulling member 124d and the pushing member 121d are movably provided in the shell 122d. The elastic member 123d is abutted against the shell 122d and the pushing member 121d, the elastic member 123d is, for example, a tension spring. When the pulling member 124d is no longer stressed in the unlocked state as shown in FIG. 6B, the elastic member 123d provides elastic restoring force, and pulls the lever 1213d and the pulling member 124d from the position of FIG. 6B to the position of FIG. 6A.

It should be supplemented that this case does not limit the setting position, type and quantity of the elastic member of the embodiment. For example, in one embodiment, the elastic member may be disposed on the pivot, and the elastic member may be a torsion spring.

In summary, the PCI-E expansion card module pushes the rotation switch through the unlocking mechanism, so that the PCI-E expansion card body can be released from the slot. In this way, even if the rotation switch is blocked by the computer components or the expansion card, the user can still easily unlock the PCI-E expansion card relative to the slot.

What is claimed is:

1. A PCI-E expansion card module, configured to insert in a slot with a rotation switch, the PCI-E expansion card module comprising: a PCI-E expansion card body, comprises an inserting portion and a positioning hook; and an unlock mechanism, disposed beside the PCI-E expansion card body, and comprises a pushing member, a shell and an elastic member, wherein the pushing member is movably disposed in the shell, the pushing member comprises a rod body and a plate protruding from a periphery of the rod body, the elastic member is sleeved on the rod body and abuts on the plate and the shell, and the elastic member is pressed through the plate along an extension direction of the rod body, wherein, when the inserting portion of the PCI-E expansion card body is inserted into the slot, the positioning hook and the rotation switch are engaged with each other to complete a limitation of the PCI-E expansion card body, the pushing member moves along the extension direction and pushes the rotation switch to push the positioning hook, and the positioning hook and the rotation switch are not engaged with each other to release the limitation of the PCI-E expansion card body.

2. The PCI-E expansion card module according to claim 1, wherein the inserting portion extends along a first direction, the pushing member is movably arranged along a second direction perpendicular to the first direction.

3. The PCI-E expansion card module according to claim 1, wherein the unlock mechanism comprises a pulling member and a lever, the pulling member is connected to one end of the lever, the pushing member is abutted against the other end of the lever.

4. The PCI-E expansion card module according to claim 3, wherein the unlock mechanism comprises a shell and an elastic member, the lever is located in the shell and is pivotally connected to the shell, the pulling member and the pushing member are movably set to the shell, the elastic member is abutted against the shell and the lever.

5. The PCI-E expansion card module according to claim 1, wherein the pushing member comprises a lever.

6. The PCI-E expansion card module according to claim 5, wherein the unlock mechanism further comprises a pulling member, the pulling member is connected to one end of the lever, the other end of the lever is suitable for abutting against the rotation switch.

7. The PCI-E expansion card module according to claim 6, wherein the unlock mechanism further comprises a shell and an elastic member, the pulling member and the pushing member is movably disposed in the shell, the elastic member is abutted against the shell and the pushing member.

8. The PCI-E expansion card module according to claim 1, wherein the inserting portion extends along a first direction, the pushing member is movably arranged along the first direction.

9. The PCI-E expansion card module according to claim 1, wherein the pushing member comprises a first segment and a second segment connected to the first segment by bending, the first segment extends along the first direction, the second segment is adapted to abut against the rotation switch.

10. The PCI-E expansion card module according to claim 9, wherein the unlock mechanism further comprises a shell and an elastic member, the pushing member is movably disposed in the shell, the elastic member is abutted against the shell and the pushing member.

* * * * *